United States Patent [19]
Edo et al.

[11] Patent Number: 5,800,949
[45] Date of Patent: Sep. 1, 1998

[54] MASK, METHOD OF PRODUCING A DEVICE USING THE MASK AND ALIGNER WITH THE MASK

[75] Inventors: Ryo Edo; Ryuichi Ebinuma, both of Utsunomiya; Hiroshi Maehara, Yokohama, all of Japan

[73] Assignee: Canon Kabushiki Kaisha, Tokyo, Japan

[21] Appl. No.: 622,004

[22] Filed: Mar. 26, 1996

[30] Foreign Application Priority Data

Mar. 28, 1995 [JP] Japan .................................. 7-094603
Sep. 20, 1995 [JP] Japan .................................. 7-266292

[51] Int. Cl.$^6$ ............................................ G03F 9/00
[52] U.S. Cl. ............................ 430/5; 430/22; 378/35
[58] Field of Search ........................ 430/5, 311, 22; 378/34, 35

[56] References Cited

U.S. PATENT DOCUMENTS

| | | |
|---|---|---|
| 4,887,283 | 12/1989 | Hosono .............................. 430/5 |
| 5,112,133 | 5/1992 | Kurosawa et al. . |
| 5,128,975 | 7/1992 | Iwamoto et al. . |
| 5,150,391 | 9/1992 | Ebinuma et al. . |
| 5,168,512 | 12/1992 | Iwamoto et al. . |
| 5,225,686 | 7/1993 | Edo . |
| 5,285,488 | 2/1994 | Watanabe et al. . |
| 5,317,615 | 5/1994 | Ebinuma et al. . |
| 5,347,561 | 9/1994 | Ebinuma . |
| 5,356,686 | 10/1994 | Fujioka et al. ..................... 430/5 |
| 5,375,157 | 12/1994 | Maehara . |
| 5,485,495 | 1/1996 | Miyachi et al. . |

FOREIGN PATENT DOCUMENTS 64-36019  2/1989  Japan .

*Primary Examiner*—S. Rosasco
*Attorney, Agent, or Firm*—Fitzpatrick, Cella, Harper & Scinto

[57] ABSTRACT

A mask includes a mask substrate on which a mask pattern is formed, a frame for supporting the mask substrate, and at least one alignment mark formed on the frame. The alignment mark is used for positioning the mask substrate on the frame. The invention also includes a method for making a mask comprising the steps of forming at least one alignment mark at a predetermined position on a mask frame, forming a mask pattern on a mask substrate at a predetermined position with respect to the alignment mark, and joining the mask substrate and the mask frame to form a mask. In addition, the method can include the step of joining the mask substrate and the frame in a predetermined positional relationship on the basis of the position of the alignment mark.

13 Claims, 7 Drawing Sheets

FIG. 10

MASK, METHOD OF PRODUCING A DEVICE USING THE MASK AND ALIGNER WITH THE MASK

BACKGROUND OF THE INVENTION

1. Field of the Invention

The present invention relates to a method of making an exposure mask and relates to a mask suitable for use in a lithography process in which an electronic circuit pattern on the mask is transferred onto a wafer surface by using X-rays in a wavelength range of, for example, about 2 to 150Å to manufacture a semiconductor device, e.g., an integrated circuit (IC) or a circuit made by large scale integration (LSI), a micromachine, a micro-optic device or the like.

2. Description of the Related Art

With the development of semiconductor integrated circuits having a higher density and a higher operating speed, the pattern line width of integrated circuits has been reduced by about 70% in the past three years for large-capacity memory devices manufactured by transferring a pattern from a mask to a semiconductor substrate by using light in a range of near ultraviolet to far ultraviolet. However, using light in such a wavelength range limits the reduction in the workable line width of semiconductor devices, which will soon be reached.

On the other hand, with the increase in the integration density of semiconductor devices, (aligners using X-rays capable of printing with a higher Resolution have recently been proposed to fulfill the need for reducing the exposure wavelength and to overcome the problem of a reduction in the depth of focus accompanying the increase in the numerical aperture of the projection optical system. Great hopes are now entertained for this use of X-ray lithography techniques as a means for simultaneously solving the above-mentioned problems of resolution and depth of focus.

Many studies of the materials and structures of X-ray masks for use in such aligners using X-rays have also been published. Ordinarily, X-ray masks have a structure in which a mask substrate is fixed on a mask frame formed of Pyrex glass or the like. The mask substrate has an X-ray transmission membrane on which a fine pattern of an X-ray absorbing material and an alignment pattern used for alignment are formed, and which is formed on a suitable supporting frame such as a silicon wafer.

Such an X-ray mask (daughter mask) is made as described below. Patterning is performed in such a manner that a pattern is directly formed by exposing an electron beam (EB) on a wafer for the daughter mask after back-etching the wafer, or a pattern of a master mask is transferred onto the wafer by exposure, thereby making a mask substrate. The mask substrate is then bonded to a mask frame, thereby forming a daughter mask.

In this process, however, the mask substrate is deformed by stress at the time of back etching or patterning. This deformation is corrected when the mask substrate is attached to the mask frame to conform to the same. A distortion is thereby caused in the pattern formed on the transmission membrane. For example, the amount of distortion due to a deformation caused at the time of back etching is about 0.1 μm. A window formed in the mask substrate by back etching ordinarily has a rectangular shape, so that the amount of deformation is particularly large along each side or at each corner of the window. If a device is manufactured by using such a mask, a pattern transferred onto the wafer is also misaligned, resulting in a failure to manufacture the device with the desired accuracy.

If an alignment pattern is placed on such a deformed transmission membrane, the accuracy with which the mask and the wafer are superposed on each other is reduced by the misalignment of the alignment pattern. Further, if there is a variation in the positional relationship between the window in the mask substrate and the mask frame after joining the mask substrate and the mask frame, the deformation of the mask caused when the mask is attached to the aligner also varies, so that superposition errors between masks are increased, resulting in a failure to manufacture devices with the desired accuracy.

SUMMARY OF THE INVENTION

In view of the above-described problems, an object of the present invention is to provide an improved mask and a method of manufacturing the mask which make it possible to produce a semiconductor device with higher accuracy.

Another object of the present invention is to provide an improved device production method and an improved aligner using such a mask.

According to one aspect, the present invention which achieves these objectives relates to a mask comprising a mask substrate on which a mask pattern is formed, a frame for supporting the mask substrate, and at least one alignment mark formed on the frame.

According to another aspect, the present invention which achieves these objectives relates to a method of producing a device comprising the steps of preparing a mask (comprising a mask substrate on which a mask pattern is formed, a frame for supporting the mask substrate, and at least one alignment mark formed on the frame), preparing a wafer, and transferring the mask pattern onto the wafer.

According to still another aspect, the present invention which achieves these objectives relates to a method of making a mask comprising the steps of forming at least one alignment mark at a predetermined position on a mask frame capable of holding a mask substrate, joining the mask substrate and the mask frame to form a mask, and forming a mask pattern on the mask substrate at a predetermined position with respect to the at least one alignment mark, and joining the mask substrate and the mask frame to form a mask.

According to still another aspect, the present invention which achieves these objectives relates to a method of making a mask comprising the steps of forming at least one alignment mark at a predetermined position on a mask frame, and joining a mask substrate and the mask frame in a predetermined positional relationship on the basis of the position of the alignment mark.

According to still another aspect, the present invention which achieves these objectives relates to an aligner comprising a stage for retaining a mask comprising a mask substrate on which a mask pattern is formed, a frame for supporting the mask substrate, and at least one alignment mark formed on the frame. The aligner further comprises a stage for retaining a wafer. The aligner also comprises aligning means for controlling the stages to align the mask and the wafer using the at least one alignment mark. In addition, the aligner comprises exposure means for transferring the mask pattern onto the wafer.

These and other objectives, advantages and features of the present invention will become apparent from the attached drawings taken in conjunction with the detailed description of preferred embodiments.

DESCRIPTION OF THE PREFERRED EMBODIMENTS

Preferred embodiments of the present invention will be described below with reference to the accompanying drawings. The present invention is not limited to an X-ray mask and can also be applied to a mask for vacuum ultraviolet exposure or the like.

Figure 1:
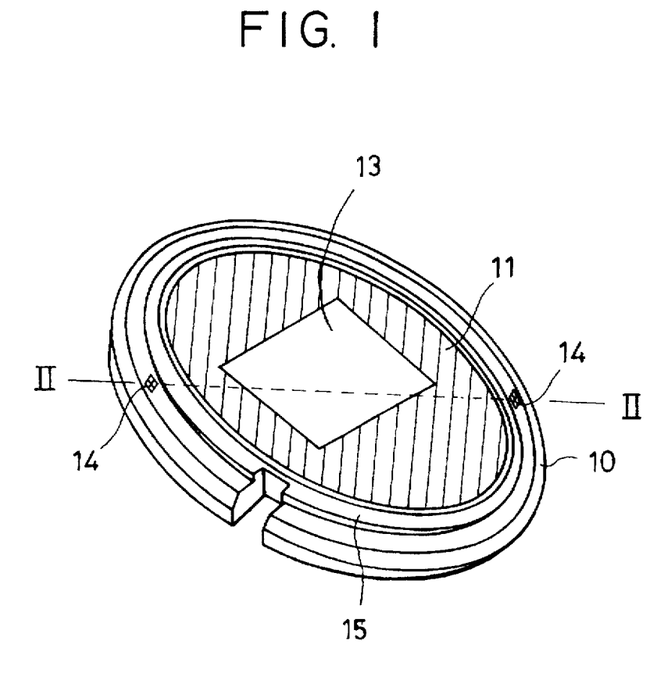
FIG. 1 is a perspective view of an embodiment of a mask in accordance with the present invention.
Figure 2:
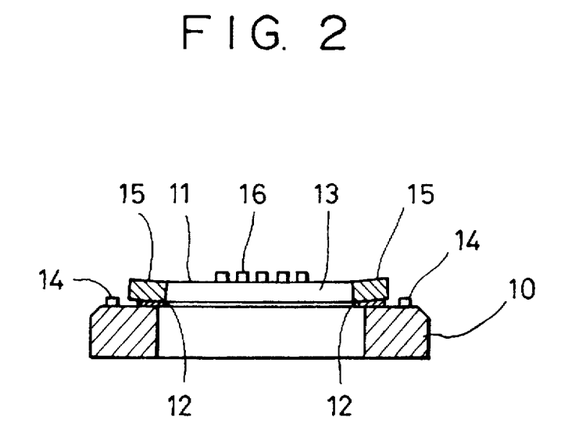
FIG. 2 is a cross-sectional view of FIG. 1 taken along line II—II.

Referring to FIGS. 1 and 2, an X-ray exposure mask of the present invention has a supporting membrane (X-ray transmission membrane) 11 formed of a material through which X-rays can pass. Transfer patterns 16 formed of a heavy metal X-ray absorber are formed on a surface of the supporting membrane 11. The supporting membrane 11 and a supporting frame which supports the circumferential end of the supporting membrane 11 form a mask substrate 15. The mask substrate 15 is supported on and is reinforced by a mask frame 10 in the form of a ring by being bonded to the same with adhesive 12. The mask substrate 15 has a back etched window 13, and transfer patterns 16 formed of the above-mentioned X-ray absorber are formed in the area on the supporting membrane 11 corresponding to the back etched window 13.

An alignment mark (hereinafter referred to as "AA mark") 14 used when the mask is made, is provided on an upper surface of the mask frame 10. A pair of AA marks 14 are provided at opposite positions in the example shown in FIG. 1. However, the number of AA marks is not limited to two, and at least one AA mark may be provided.

Figure 3:
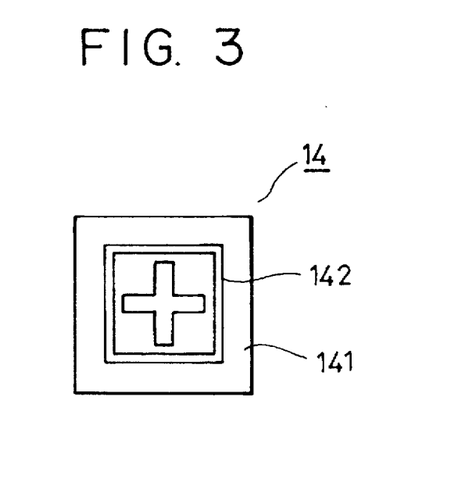
FIG. 3 is an illustration of an AA mark of FIG. 1.

FIG. 3 shows details of the pattern configuration of each AA mark 14. The AA mark 14 is formed of a mark portion 142 and a wafer chip 141. For example, the AA mark 14 is provided in such a manner that a portion of a wafer on which a mark pattern is printed is cut out as a small chip and is bonded to the mask frame 10.

Figure 4:
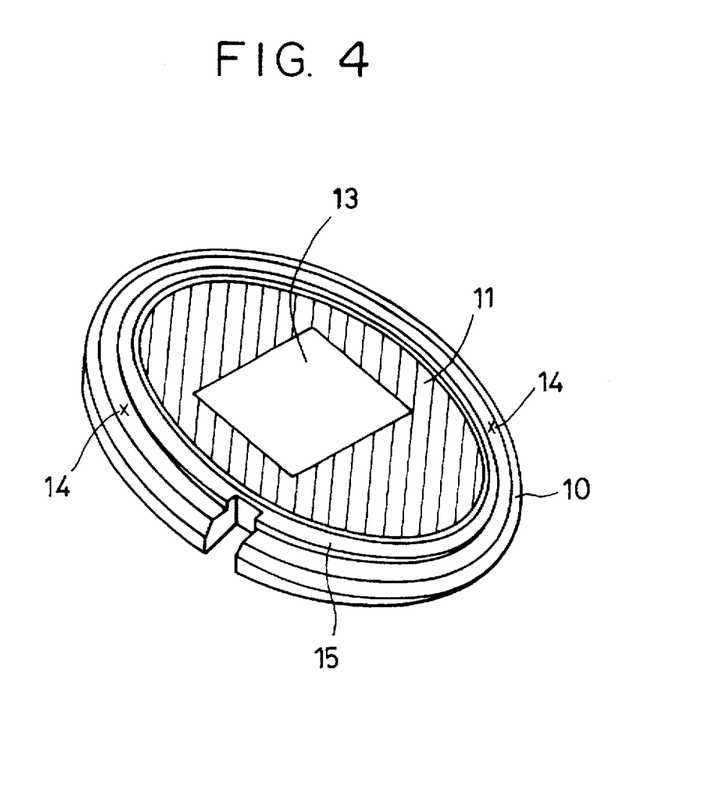
FIG. 4 is a perspective view of an example of a modified mask.

The alignment marks provided on the mask frame may be formed as marking-off lines, as shown in FIG. 4. The mask frame may be worked to form such marking-off lines when it is made.

A method of manufacturing the above-described mask will now be described. First, a back-etched wafer is provided and, by observing an edge of the back-etched window, the back-etched wafer is positioned on a mask frame for a daughter mask so that x-, y- and θ-positions of its edge coincide with predetermined x-, y- and θ-positions on this mask frame. In this state, the back etched wafer is bonded to the mask frame. (This combination of members will hereinafter be referred to as a "daughter mask blank".)

Next, a master mask having original patterns to be transferred onto the daughter mask is loaded and positioned in a mask copying aligner. The daughter mask blank prepared as described above is transported in the aligner and is supported on a chuck and held thereto by vacuum attraction. An alignment unit is provided in the transport path. The two marks provided on the mask frame of the daughter mask blank are read by the alignment unit to obtain position information by calculating misalignment of the mask frame with respect to predetermined x, y, and θ coordinates of the master mask, and the mask frame is positioned on the chuck by vacuum attraction on the basis of this position information.

The daughter mask blank, having the back etched window at the predetermined position with respect to the frame thereof, is positioned with respect to the master mask by the above-described mask blank loading operation. In this state, patterns of the master mask are transferred onto the daughter mask.

Next, the patterned daughter mask is plated with the X-ray absorber and is processed by a post-process such as a resist removal process, thus completing the manufacture of the daughter mask.

Alternatively, the edges of the back etched window may be positioned with respect to AA marks provided on the frame, followed by bonding.

An example of a process in which an alignment unit used only for positioning the daughter mask blank is provided in a mask blank transport path of an aligner has been described. However, the daughter mask blank may alternatively be positioned by using an alignment unit which is also used for alignment between the mask and an exposed substrate at the time of manufacturing a product device.

To form the patterns on the daughter mask, a projection aligner using g-line, i-line or excimer laser light may be employed. Alternatively, direct patterning may be performed by using an electron beam (EB) or a focused ion beam (FIB). In such a case, patterning is performed after confirming the position of the daughter mask blank by detecting the alignment marks on the mask frame with the EB or FIB.

In the above-described examples of the mask manufacturing method, AA marks 14 are previously formed at predetermined positions on the mask frame 10 to enable accurate patterning about the center of the window 13 of the mask, and positioning for patterning is performed on the basis of AA marks 14. At this time, it is necessary that the positions of AA marks 14 are accurately known with respect to the sides and corners of the window 13 of the X-ray mask. Patterning is performed on the basis of AA marks 14 so that the patterns are accurately arranged about the center of the window 13 of the X-ray mask. This method enables the size of the window 13 to be reduced to a necessary minimum size and also enables the patterns to be arranged by avoiding portions of the X-ray transmission membrane 11 where the amount of deformation is large, thereby improving the accuracy of the pattern position. A plurality of AA marks 14 are provided to enable the patterning position to be measured with respect to the two axes in the X- and Y-directions of the pattern plane and with respect to rotation about the Z-axis perpendicular to the pattern plane.

A method of adjusting the positional relationship between the window of the X-ray mask, the AA marks, and device patterns for exposure with high accuracy will next be described.

Figure 5A:
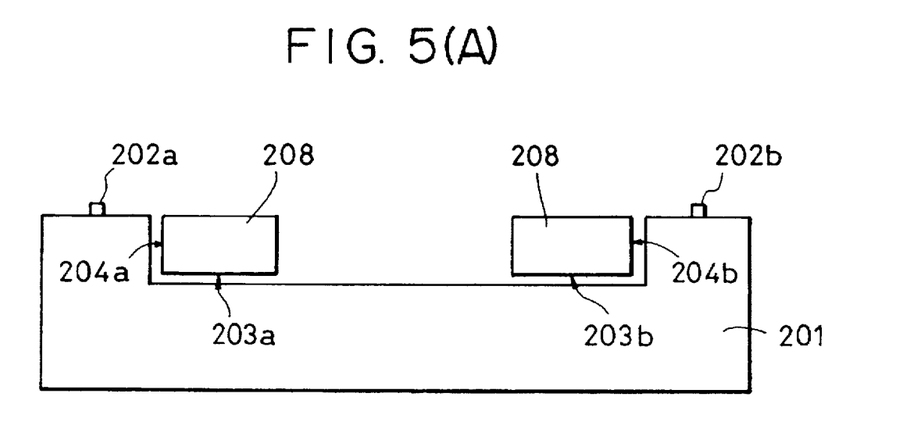
FIGS. 5(A) and 5(B) are schematic diagrams illustrating the relationship between a mask and a mask holder.
Figure 5B:
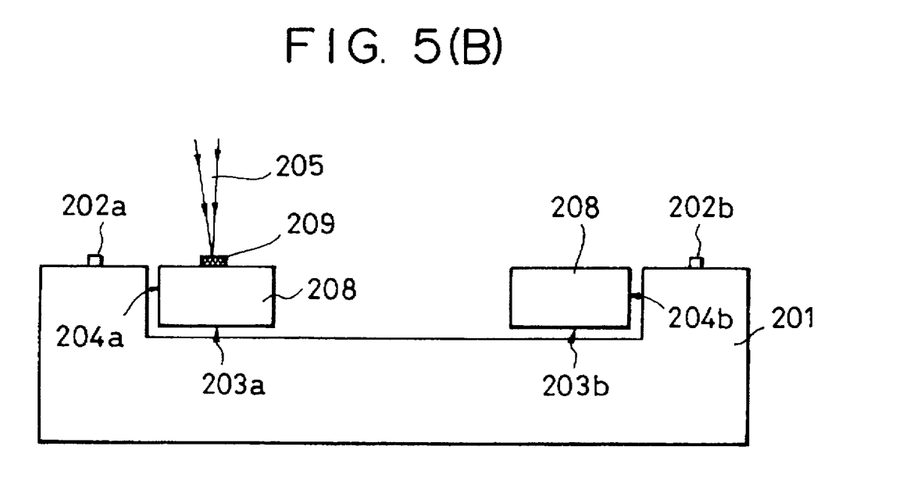

FIGS. 5(A) and 5(B) are schematic diagrams of the placement of an AA mark 209 on a mask frame 208. A member 201 is a mask frame holder of an ion beam writing apparatus for forming an AA mark on the mask frame. Three-point-support pins having portions indicated at 203a and 203b are provided to minimize deformations of the mask frame 208. Pins 204a and 204b are provided to accurately center the mask frame 208 on the mask frame holder 201. Positioning marks 202a and 202b are provided on the mask holder 201 to accurately control the writing position of an ion beam 205. The mask frame 208 is accurately centered on the mask holder 201 by these means. The positioning marks 202a and 202b on the mask holder 201 are detected to determine the writing position of the ion beam 205 to deposit the desired metal on the mask frame 208, thereby forming AA mark 209 at a correct position with respect to the configuration of the mask frame 208 so as to be used as a reference for positioning in a mask manufacturing process.

FIGS. 6(A)–6(H) show a process for joining a mask substrate and a mask frame to each other while being maintained in a correct positional relationship. First, a silicon wafer 301 on which a 2 μm thick silicon nitride film 302, for forming an X-ray transmission membrane is formed, is prepared as a mask substrate 300 for an X-ray mask (FIG. 6(A)). A portion of the silicon nitride film on one side of the wafer corresponding to an X-ray mask window 303 is removed by dry etching using $SF_6$ gas (FIG. 6(B)).

Figure 6A:
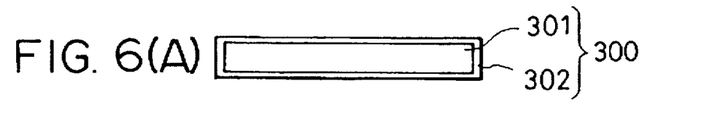
FIG. 6(A) to 6(H) are schematic diagrams of a mask making process.
Figure 6B:
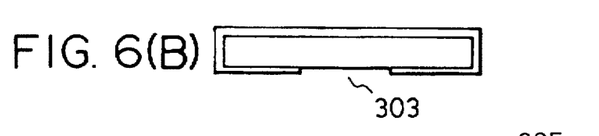

Next, the silicon wafer is etched by using a 30 wt % potassium hydroxide water solution at 100° C. through the area from which the silicon nitride( film has been removed, thereby forming the window 303. A, a result, a self-supporting membrane of silicon nitride is formed on the other side of the mask substrate 300 opposite from the window.

Figure 6C:
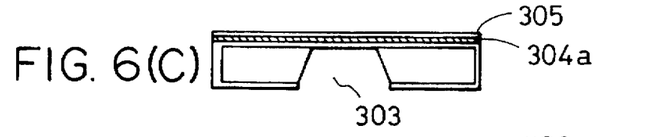
Figure 6D:
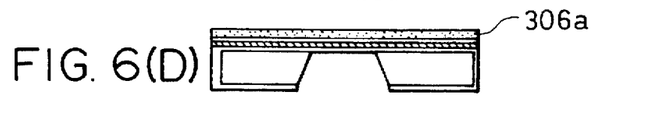
Figure 6E:
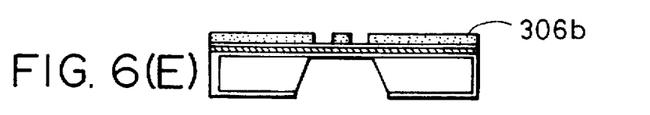
Figure 6F:
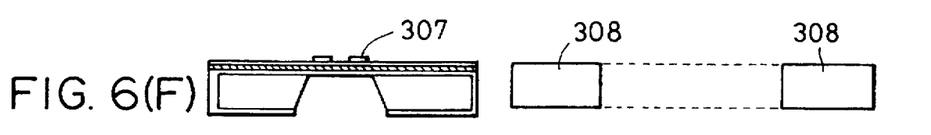
Figure 6G:
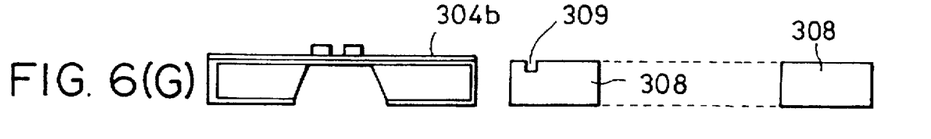

Thereafter, chrome and gold provided as electrode materials for forming X-ray absorber patterns on the silicon nitride film by plating are successively deposited by electron beam deposition so as to form a 5 nm thick chrome film 304a and a 50 nm thick gold film 305 (FIG. 6(C)). Next, polymethylmethacrylate (PMMA) 306a provided as an electron beam resist is applied to the deposited film to have a thickness of 1 μm (FIG. 6(D)). On this resist 306a, an alignment pattern and patterns for forming a device are written on the basis of the position of an edge of the window 303 of the mask substrate 300 by an electron beam writing apparatus having an accelerating voltage of 100 kV. The alignment pattern is used to align the patterns for forming a device with the wafer. After development, a casting mold 306b for X-ray absorber patterns 307 is formed (FIG. 6(E)). Thereafter, this mask substrate is plated with gold to obtain 0.7 μm thick X-ray absorber patterns 307 formed of gold (FIG. 6(F)). The patterns 307 form device patterns and a positioning mark or the like. The mask substrate is then moved to a reactive ion etching (RIE) apparatus. In this apparatus, the resist is removed by $O_2$ RIE, the Au electrode film is removed by Ar sputtering and the Cr film is transparentized to produce a transparentized Cr film 304b by being oxidized by $O_2$ RIE, thereby obtaining an X-ray mask structure (FIG. 6(G)).

Figure 6H:
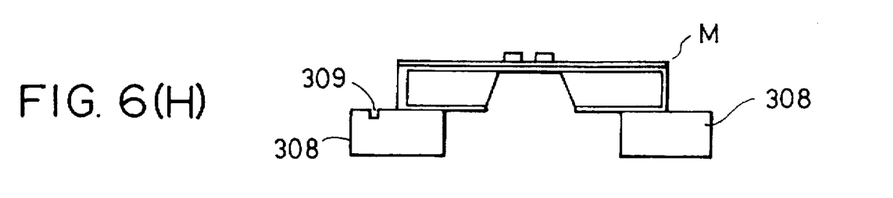

In addition, a mask frame 308 for reinforcing and fixing the mask is prepared. An AA mark 309 for positioning the mask substrate 300 on the mask frame 308 at the time of joining the mask substrate 300 to the mask frame 308 is formed on the mask frame 308 on the basis of the outside diameter of the mask frame. AA mark 309 is formed by laser writing, electron beam writing, numerical control (NC) machining, photolithography or the like.

Next, the mask substrate 300 and the mask frame 308 are positioned relative to each other bay using the positioning mark on the mask substrate 300, the coordinates of which are known, and the AA mark 309 on the mask frame 308. The mask substrate 300 and the mask frame 308 are then joined to each other with an epoxy adhesive or the like (FIG. 6(H)). In X-ray mask structure M thus made, the relationship between the outside diameter of the mask frame 308, the position of the window of the mask substrate 300, and the position of the mask patterns are determined with markedly high accuracy. Deformations in the mask pattern surface are thereby reduced.

FIGS. 7(A) to 7(H) show an example of a process of accurately forming patterns on a mask substrate on the basis of an alignment mark provided on a mask frame. First, a silicon wafer 401, on which a 2 μm thick silicon carbide film 402 for forming an X-ray transmission membrane is formed, is prepared as a mask substrate 400 for an X-ray mask (FIG. 7(A)). A portion of the silicon carbide film on one side of the wafer corresponding to an X-ray mask window 403 is removed by dry etching using $SF_6$ gas (FIG. 7(B)).

Subsequently, the silicon wafer is etched by using a 30 wt % potassium hydroxide water solution at 100° C. through the area from which the silicon carbide film has been removed, thereby forming the window 403. As a result, a self-supporting membrane of silicon carbide is formed in the window on the other side of the mask substrate 400 (FIG. 7(C)).

Figure 7A:
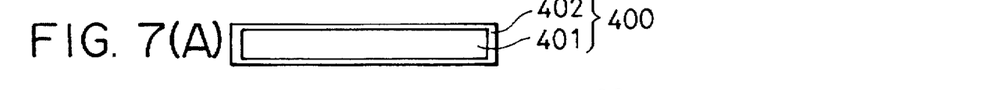
FIG. 7(A) to 7(H) are schematic diagrams of another mask making process.
Figures 7B, 7C:
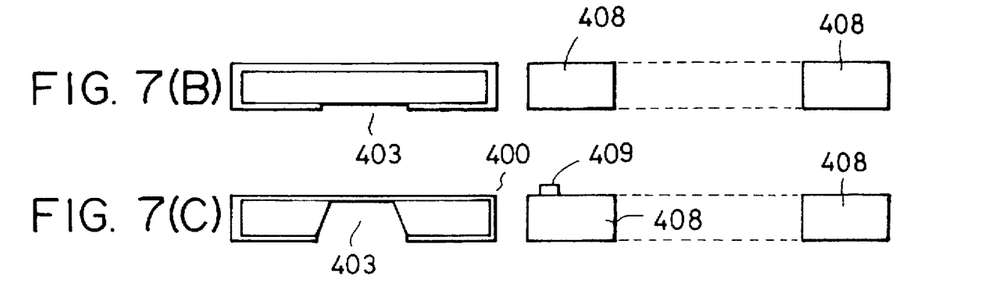
Figure 7D:
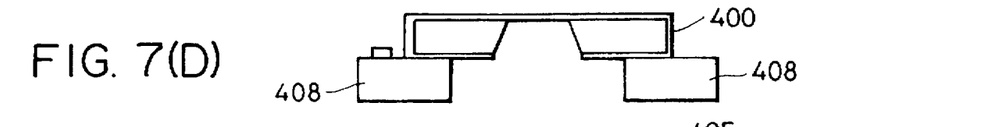
Figure 7E:
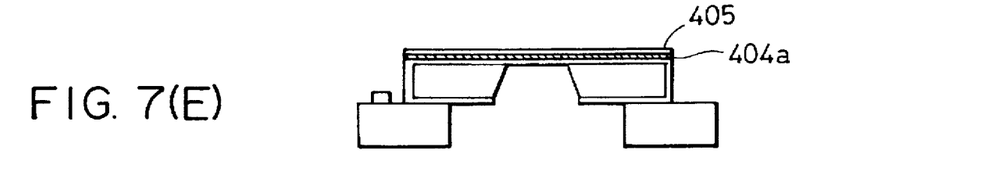
Figure 7F:
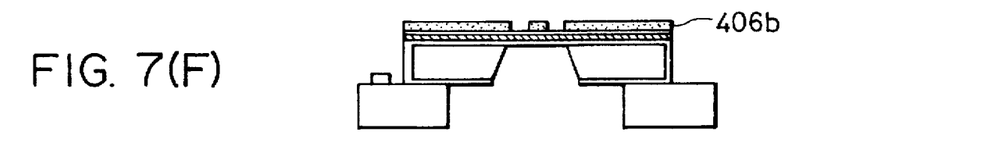
Figure 7G:
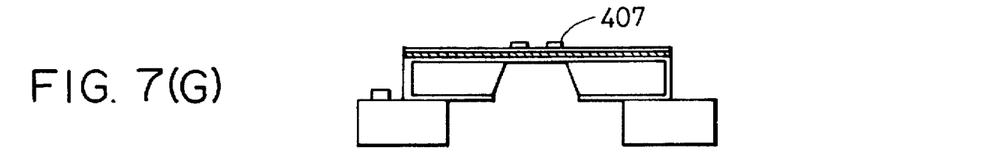

Next, a mask frame 408 for reinforcing and fixing the mask substrate 400 is prepared. An AA mark 409 for positioning the mask substrate 400 on the mask frame 408 at the time of joining the mask substrate 400 to the mask frame 408 is formed on the mask frame 408 on the basis of the outside diameter of the mask frame 408. AA mark 409 is formed by laser writing, electron beam writing, numerical control (NC) machining, photolithography, or the like.

Next, the mask substrate 400 and the mask frame 408 are positioned relative to each other by using an arbitrary portion of the window of the mask substrate 400 and the positioning AA mark 409 on the mask frame 408. The mask substrate 400 and the mask frame 408 are then joined to each other with an epoxy adhesive or the like (FIG. 7(D)). Thereafter, chrome and gold provided as electrode materials for forming X-ray absorber patterns by plating are successively deposited by electron beam deposition so as to form a 5 nm thick chrome film 404a and a 50 nm thick gold film 405 (FIG. 7(E)). Next, PMMA provided as a far ultraviolet resist is applied to the deposited film to have a thickness of 1 μm. This resist is exposed to rays from an alignment pattern and patterns for forming a device on the basis of the alignment mark on the mask frame by using a light source of a KrF excimer laser far ultraviolet operating aligner, thereby forming a casting mold for the X-ray absorber patterns 406b (FIG. 7(F)). The alignment pattern is used to align the patterns for forming a device with the wafer.

Thereafter, this substrate is plated with gold to obtain 0.7 μm thick X-ray absorber patterns 407 formed of gold. The mask substrate is then moved to a reactive ion etching (RIE) apparatus. In this apparatus, the resist is removed by $O_2$ RIE (FIG. 7(G)), the Au electrode film is removed by Ar sputtering and the Cr film is transparentized to produce a transparentized Cr film 404b by being oxidized by $O_2$ RIE, thereby obtaining an X-ray mask (FIG. 7(H)).

Figure 7H:
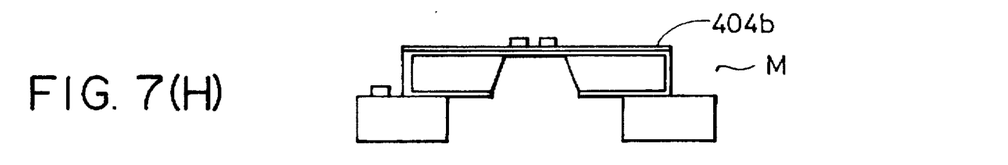

In X-ray mask M thus made, the relationship between the outside diameter of the mask frame, the position of the window of the mask and the position of the mask patterns are determined with markedly high accuracy, so that deformations in the mask pattern surface are reduced.

Each of the processes of FIGS. 6(A)–6(H) and 7(A)–7(H) has been described with respect to use of one alignment mark on the frame. Needless to say, two or more alignment marks and corresponding positioning mares or the like may alternatively used for the above-described positioning.

Figure 8:
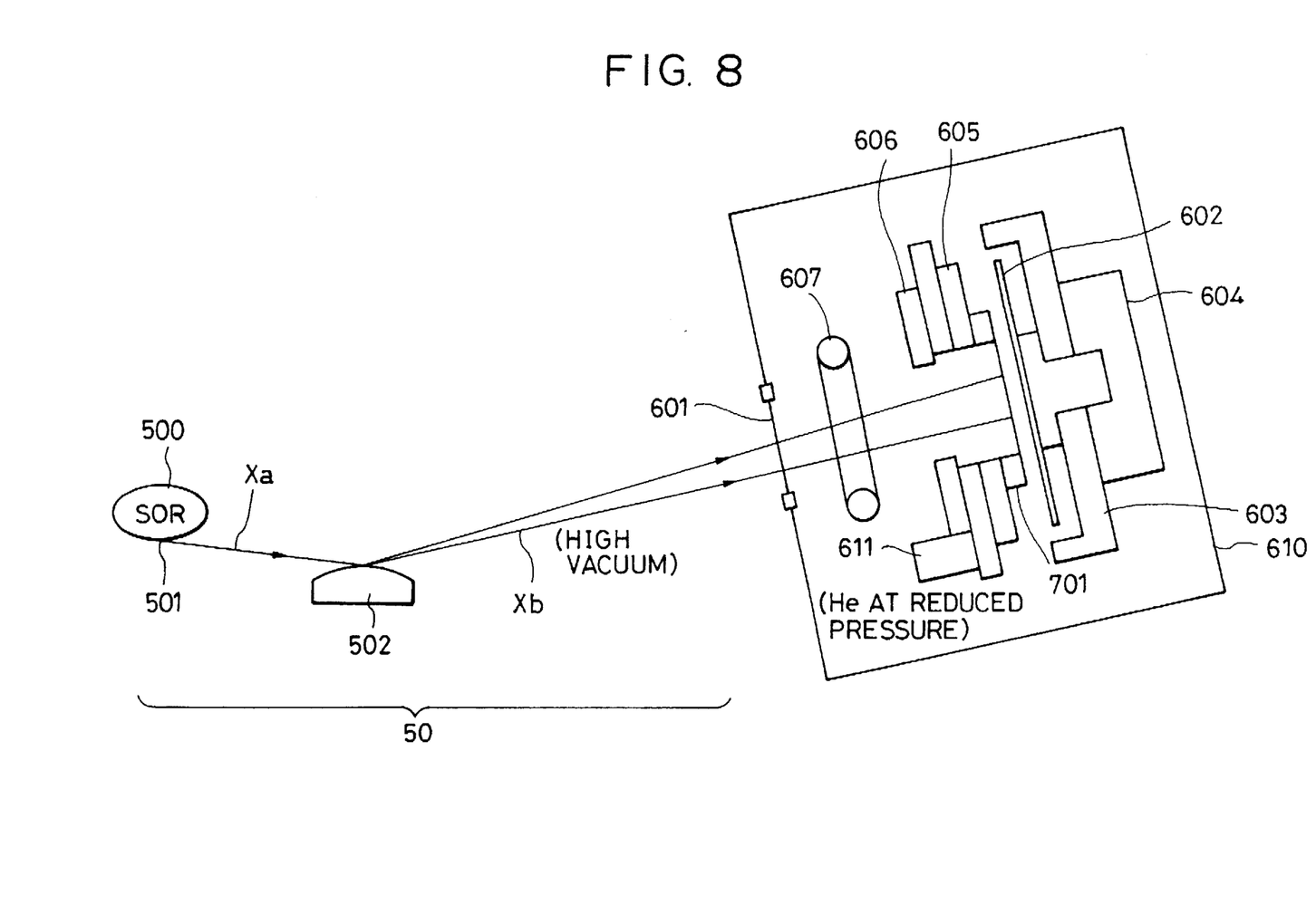
FIG. 8 is a schematic diagram of an aligner.

FIG. 8 is a schematic diagram of essential portions of an aligner system using the above-described exposure mask. A synchrotron orbital radiation (SOR) ring 500 is provided which has an X-ray emission point 501. X-rays xa emerge from the emission point 501 in the form of a sheet beam which is wide and uniform in intensity in a lateral direction and which is very thin n a vertical direction. The beam of X-rays xa is reflected by a cylindrical mirror 502 so as to spread in the vertical direction to be formed into the shape of a beam xb having a generally rectangular cross section, thereby obtaining a rectangular exposure area.

A Be membrane 601 separates an aligner from a beam line and SOR section 50 containing the mirror. A high vacuum is maintained on the SOR 500 side of the membrane 601 while the aligner is accommodated in a chamber 610 in which a He atmosphere is maintained at a certain reduced pressure. A wafer 602 is provided as an exposed member to be exposed to the beam from SOR 500. The wafer 602 is supported on a wafer chuck 603 and held thereon by vacuum attraction. The wafer chuck 603 is mounted on a wafer stage 604. The wafer stage 604 is moved to position the wafer 602.

A mask 701 is held on a mask stage by vacuum attraction to be maintained in such a position as to face the wafer 602. An alignment unit 606 has an optical system for detecting an alignment pattern in the form of an alignment mark provided on the mask 701 and a positioning alignment mark provided in the exposure area of the wafer 602, and a calculation section for calculating a misalignment of these marks. A pre-alignment unit 611 is also provided for prealigning the mask 701 and the wafer 602.

Figure 9:
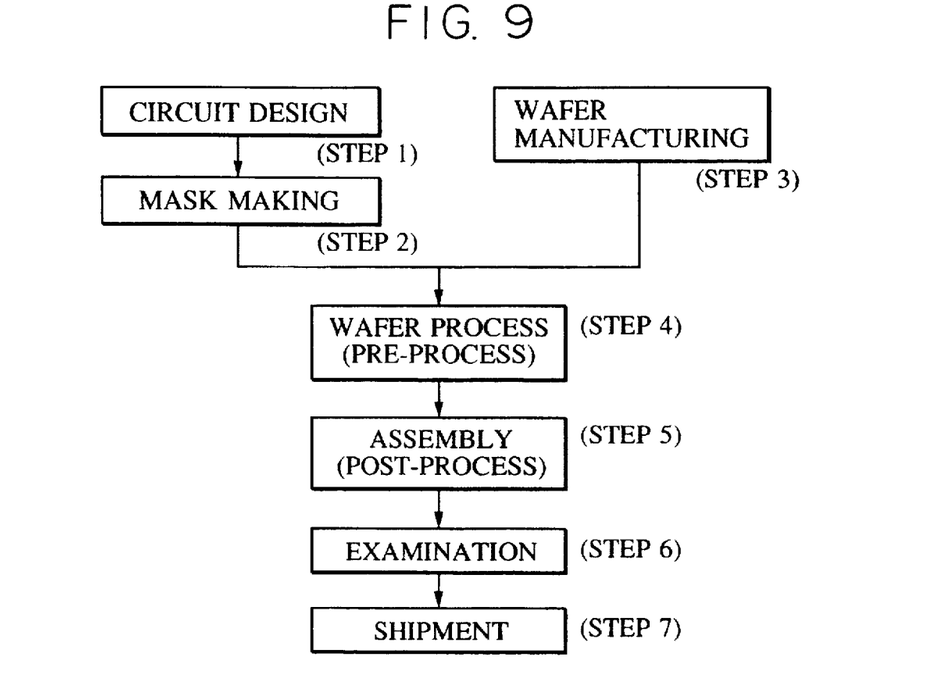
FIG. 9 is a flowchart of a device manufacturing method.

The operation of this embodiment will now be described with reference to FIGS. 8 and 9. X-rays xa in the form of a sheet beam traveling out of the SOR ring 500 are formed into exposure beam xb expanded by the cylindrical mirror 502. Exposure beam xb is uniform in intensity in the lateral direction but has a non-uniform intensity distribution in the vertical direction. To obtain a uniform amount of exposure through the entire exposure area by correcting this intensity distribution, exposure intensity correction is made with a shutter 607.

The wafer 602 and the mask 701 are respectively loaded at an exposure position in the aligner by an unillustrated loading means. After being loaded, the wafer 602 is held on the wafer chuck by vacuum attraction while the mask is held on the mask chuck by vacuum attraction. Then, the alignment unit 606 moves to the position at which it detects the alignment mark on the mask 701. After the mark on the mask 701 has been detected, the wafer stage 604 moves to the position at which the alignment mark of the wafer 602 is superposed on the mark on the mask 701.

The alignment unit 606 detects the mark on the mask 701 and the alignment mark on the wafer 602 and calculates the amount of misalignment therebetween in the calculation section thereof. The wafer stage 604 is moved so that the calculated amount of misalignment becomes zero, thereby positioning the wafer 602 with respect to circuit patterns on the mask 701. After positioning therebetween, the shutter 607 is operated to effect exposure. The wafer 602 is then processed by a well-known development process. A semiconductor device is thus manufactured.

An embodiment of a system for manufacturing a semiconductor device by using the above-described aligner will next be described. FIG. 9 is a flowchart of the method of manufacturing a semiconductor device (a semiconductor chip of IC, LSI or the like, a liquid crystal panel, a charge coupled device (CCD) or the like).

In Step 1 (circuit design) of this embodiment, a circuit of a semiconductor device is designed. In Step 2 (mask making), masks on which designed circuit patterns are formed are made.

On the other hand, in Step 3 (wafer manufacturing), wafers are manufactured by using a material such as silicon. In Step 4 (wafer process) called pre-process or front-end process, the masks and wafers prepared as described above are used to form actual circuits on each wafer by lithography techniques.

Each of the completed daughter masks is loaded in an aligner. The mask is transported to be chucked with a mask chuck, whereby the patterns thereof are set in a certain region with respect to the aligner. Therefore, no misalignment occurs between the mask and the alignment unit even if the alignment unit does not perform searching for the patterns on the mask.

Each wafer 602 is loaded and is placed so as to face the mask 701, a misalignment therebetween is detected by the alignment unit 606, and the wafer stage 604 is moved to correctly position the wafer 602 and the mask 701 relative to each other. When the wafer 602 and the mask 701 are aligned, exposure is started. After exposure, the wafer 602 is moved one step so that the next shot area is ready for exposure, and the operation for alignment and so on is successively performed. Advantageously, according to this method, the throughput can be improved because no searching operation of the alignment unit 606 need be performed when the mask 701 is loaded.

In the Step 5 (assembly) called the post-process, semiconductor chips are formed by using the wafers manufactured in Step 4. Step 5 includes assembly steps (dicing, bonding), a packaging step (chip molding) and other steps.

In Step 6 (examination), a test for confirming the operation of the semiconductor device manufactured in Step 5, a test for examining the durability of the semiconductor device and the like, are performed. After these steps, the semiconductor device is completed to be shipped (Step 7).

Figure 10:
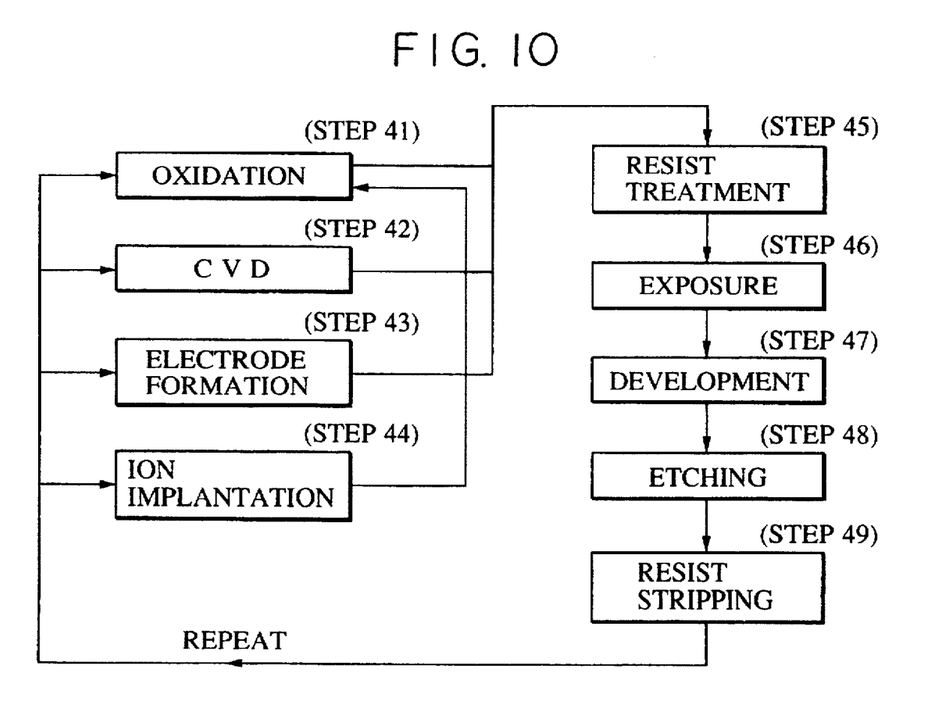
FIG. 10 is a flowchart of a process in the device manufacturing system shown in FIG. 9.

FIG. 10 is a flowchart showing details of the wafer process of Step 4. First, in Step 41 (oxidation), the surface of the wafer is oxidized. In Step 42, an insulating film is formed on the wafer surface by chemical vapor deposition (CVD).

In Step 43 (electrode formation), electrodes are formed by deposition on the wafer. In Step 44 (ion implantation), ions are implanted in the wafer. Step 45 (resist treatment), a photosensitive material is applied to the wafer. In Step 46 (exposure), the wafer is exposed to rays from the circuit patterns of the mask in the above-mentioned aligner, thereby printing the circuit patterns on the wafer.

In Step 47 (development), the exposed wafer undergoes development. In step 48, (etching), portions other than the developed resist image area removed. In Step 49 (resist stripping), the resist, unnecessary after etching, is removed. These steps are repeatedly performed to form multiple circuit patterns on the wafer.

If the manufacturing method described as an embodiment of the present invention is used, a semiconductor device having a high integration density, which is difficult to manufacture by a conventional process, can easily be manufactured.

While the present invention has been described with respect to what is presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of making a mask using at least one alignment mark on a mask frame for both aligning the mask frame with a mask substrate and aligning a pattern to be formed on the mask substrate with the mask frame, said method comprising the steps of:

forming the at least one alignment mark at a predetermined position on the mask frame capable of holding the mask substrate;

using the at least one alignment mark for aligning the mask substrate and the mask frame and then joining the mask substrate and the mask frame; and using the at least one alignment mark for forming a mask pattern on the mask substrate at a predetermined position with respect to the at least one alignment mark.

2. A method according to claim 1, wherein the mask is a daughter mask, wherein said step of using the at least one alignment mark for aligning the mask substrate and the mask frame and then joining the mask substrate and the mask frame comprises the steps of:

providing, as the mask substrate, a wafer having a back-etched window;

positioning the wafer on the mask frame having a plurality of alignment marks thereon;

bonding the wafer to the mask frame after said positioning step to form a daughter mask blank, and wherein said step of using the at least one alignment mark for forming a mask pattern on the mask substrate comprises the steps of:

providing a master mask having original patterns to be transferred onto the daughter mask blank;

aligning the daughter mask blank with the master mask by reading the alignment marks on the mask frame; and transferring the original patterns of the master mask to the aligned daughter mask blank to produce a patterned daughter mask with the mask pattern thereon.

3. A method according to claim 1, wherein said step of using the at least one alignment mark for forming a mask pattern on the mask substrate comprises the step of adjusting the positional relationship between a back-etched window of the mask substrate, a plurality of the alignment marks, and the mask pattern.

4. A method according to claim 1, wherein the mask is an X-ray mask and the pattern is made of X-ray absorbing material.

5. A method according to claim 1, wherein the mask pattern is formed by pattern projection of a master mask.

6. A method according to claim 1, wherein the mask pattern is formed by direct patterning by using an electron beam or a focused ion beam.

7. The method according to claim 1, wherein the mask substrate comprises a back-etched window, and wherein said step of using the at least one alignment mark for aligning the mask substrate and the mask frame comprises the step of positioning the mask substrate and the mask frame relative to each other by using an arbitrary portion of the back-etched window and the at least one alignment mark.

8. A method of making a mask using at least one alignment mark on a mask frame for both aligning the mask frame with a mask substrate and aligning a pattern to be formed on the mask substrate with the mask frame, said method comprising the steps of:

providing the mask frame on which the at least one alignment mark is formed at a predetermined position;

using the at least one alignment mark for aligning the mask substrate and the mask frame and then joining a mask substrate and the mask frame in a predetermined positional relationship on the basis of the position of the at least one alignment mark; and using the at least one alignment mark for forming a mask pattern on the mask substrate at a predetermined position with respect to the at least one alignment mark.

9. A method according to claim 8, wherein said joining step comprises the step of joining the mask substrate and the mask frame by using the relationship between the plurality of alignment marks and an edge of a window formed in the mask substrate.

10. A method according to claim 8, wherein the mask is an X-ray mask and the pattern is made of X-ray absorbing material.

11. A method according to claim 8, wherein the mask pattern is formed by pattern projection of a master mask.

12. A method according to claim 8, wherein the mask pattern is formed by direct patterning by using an electron beam or a focused ion beam.

13. The method according to claim 8, wherein the mask substrate comprises a back-etched window, and wherein said step of using the at least one alignment mark for aligning the mask substrate and the mask frame comprises the step of positioning the mask substrate and the mask frame relative to each other by using an arbitrary portion of the back-etched window and the at least one alignment mark.

* * * * *

UNITED STATES PATENT AND TRADEMARK OFFICE
CERTIFICATE OF CORRECTION

PATENT NO.    : 5,800,949

DATED         : September 1, 1998

INVENTOR(S)   : RYO EDO, ET AL.

It is certified that error appears in the above-identified patent and that said Letters Patent is hereby corrected as shown below:

COLUMN 1:

Line 27, "(aligners" should read --aligners--; and
    Line 28, "Resolution" should read --resolution--.

COLUMN 5:

Line 27, "nitride(" should read --nitride--;
    Line 28, "A," should read --As--; and
    Line 67, "bay" should read --by--.

COLUMN 7:

Line 4, "mares" should read --marks--;
    Line 5, "used" should read --be used--; and
    Line 11, "n" should read --in--.

UNITED STATES PATENT AND TRADEMARK OFFICE
CERTIFICATE OF CORRECTION

PATENT NO.   : 5,800,949

DATED        : September 1, 1998

INVENTOR(S)  : RYO EDO, ET AL.

It is certified that error appears in the above-identified patent and that said Letters Patent is hereby corrected as shown below:

COLUMN 9:

Line 1, "ha.3" should read --has--.

Signed and Sealed this

Eleventh Day of May, 1999

Attest:

Q. TODD DICKINSON

*Attesting Officer*    *Acting Commissioner of Patents and Trademarks*